Feb. 10, 1959 N. E. LINDENBLAD 2,872,788

THERMOELECTRIC COOLING APPARATUS

Filed Feb. 23, 1956 4 Sheets-Sheet 1

INVENTOR.
Nils E. Lindenblad
BY Morris A. Rabkin
ATTORNEY.

Feb. 10, 1959 N. E. LINDENBLAD 2,872,788

THERMOELECTRIC COOLING APPARATUS

Filed Feb. 23, 1956 4 Sheets-Sheet 2

INVENTOR.
Nils E. Lindenblad

BY Morris A. Rabkin

ATTORNEY.

THERMOELECTRIC COOLING APPARATUS

Filed Feb. 23, 1956 4 Sheets-Sheet 3

INVENTOR.
Nils E. Lindenblad
BY
Morris ... [signature]
ATTORNEY.

Feb. 10, 1959    N. E. LINDENBLAD    2,872,788

THERMOELECTRIC COOLING APPARATUS

Filed Feb. 23, 1956    4 Sheets-Sheet 4

INVENTOR.
Nils E. Lindenblad
BY
Morris L. Rahkin
ATTORNEY.

United States Patent Office 2,872,788

Patented Feb. 10, 1959

2,872,788

THERMOELECTRIC COOLING APPARATUS

Nils E. Lindenblad, Princeton, N. J., assignor to Radio Corporation of America, a corporation of Delaware Application February 23, 1956, Serial No. 567,111

11 Claims. (Cl. 62—3)

The present invention relates to improvements in electronic cooling apparatus, and more particularly to an improved thermoelectric refrigerating apparatus.

In thermoelectric refrigerating apparatus, cooling is produced by means of a heat pump consisting of an arrangement of thermocouples provided by interconnected bodies of dissimilar thermoelectric materials. In accordance with the Peltier effect, one junction between the dissimilar materials becomes cold while the other junction becomes hot when a direct current is passed through the materials. Heat will be absorbed by the cold junctions and liberated at the hot junctions. A major problem in the design of thermoelectric refrigerating apparatus is in the dissipation of heat at the hot junctions. Efficient means for dissipating heat at the hot junctions have long been sought after, to provide for the practical operation of thermoelectric refrigerating apparatus. Heretofore, thermoelectric cooling and refrigerating apparatus has incorporated heat transfer systems using circulated cooling fluids. Fluids, such as water, which may be pre-cooled are circulated in heat exchange relationship with the hot junctions of the thermocouples in the heat pump.

Although heat transfer with circulated fluids has been effective, similarly effective, but more convenient, means for dissipating thermoelectrically generated heat are desirable. To this end, schemes have been suggested for replacing fluid heat transfer systems with air cooling. For example, forced air cooling of the hot junctions in thermoelectric heat pumps for refrigerating apparatus has been attempted. None of such schemes has been found to give overall practical and efficient results in thermoelectric refrigerating apparatus. By means of the present invention, an improved system of air cooling has been applied to solve many of the heat transfer problems of electronic refrigeration. Utilization of the present invention has been found to result in efficient operation of air cooled electronic cooling apparatus using thermoelectric heat pumps.

An object of the present invention is, therefore, to provide improved electronic cooling apparatus.

Another object of the present invention is to provide electronic cooling apparatus utilizing improved means for the dissipation of heat from the heat generating elements therein.

A further object of the present invention is to provide thermoelectric refrigerating apparatus incorporating improved air cooled thermoelectric heat pumps.

A still further object of the present invention is to provide an air cooled thermoelectric refrigerator in which all moving parts are eliminated.

It is a still further object of the present invention to provide a thermoelectric refrigerator in which constructional complexities are reduced and which is adapted to be constructed in accordance with mass production techniques.

An electronic thermoelectric refrigerating apparatus constructed in accordance with the present invention may include a cooling compartment suitable for the storage of the food and a freezing chest, both of which incorporate air cooled thermoelectric heat pumps. The heat pump for the cooling compartment is provided with an arrangement of thermocouple elements that may be distributed over some of the walls of the compartment. Each of the thermocouple elements incorporates novel means for dissipating the heat at the hot junctions thereof. For example, these heat dissipating means may be in the nature of fans individually mounted in heat exchange relationship with the hot junctions of the thermocouple elements. The mounting arrangement is provided so that efficient heat transfer between the heat dissipating members and the hot junctions is maintained without imparting a mechanical strain on the bodies of thermoelectric material of the element.

The freezing chest is provided with a novel heat dissipating structure which maintains the hot junctions of the thermocouple elements of the freezing chest heat pump at low temperatures. Since the hot junctions are maintained at low temperatures by the novel heat dissipating means provided by the present invention, the temperature of the cold junctions descends into the freezing zone. This heat dissipating means may include a receptacle containing a fluid, such as water. The walls of the receptacle are provided with heat dissipating members which may be in the nature of fins. The hot junctions of the thermocouples of the freezing compartment heat pump are immersed in the water. The water, thus, undergoes convective circulation and carries the heat generated by the hot junctions to the walls of the receptacle where it is dissipated by the heat dissipating members.

In accordance with the present invention, the refrigerator may be arranged so as to eliminate mechanically movable parts for forcing the air over the heat dissipating members in the heat pumps. The units of the thermoelectric refrigerator, which must dissipate larger amounts of heat, are placed above those which dissipate smaller amounts of heat or above such units where lowest possible dissipation temperature is most essential. For example, the refrigerator may be enclosed in a casing having air inlets or vents at the bottom thereof communicating with air outlets or vents positioned at or near the top of the casing. The freezing chest unit is located at the bottom of the casing. The cooling compartment is supported in the intermediate portion of the casing. A power supply for generating direct current for the thermoelectric heat pumps is located at the top of the casing. Consequently, a convective flow of cool air will be produced. Heat dissipated by the heat dissipating members of the individual heat pumps will be carried away by the air passing over them.

Other objects and advantages of the present invention will, of course, become apparent and immediately suggest themselves to those skilled in the art to which the invention is directed from a reading of the following specification in connection with the accompanying drawings in which.

Figure 1:
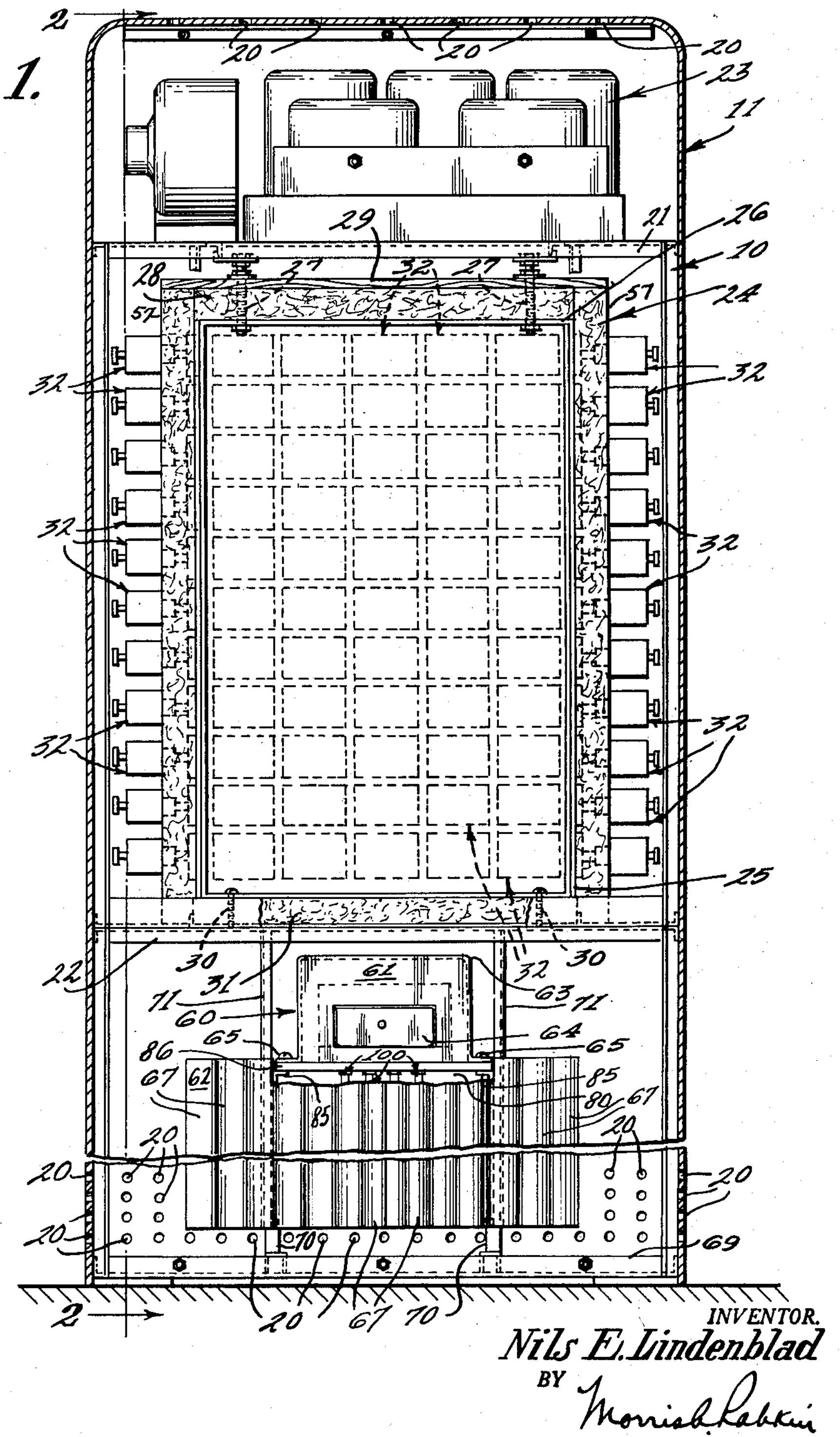
Figure 1 is a sectional front view schematically showing a thermoelectric refrigerator incorporating the present invention.
Figure 2:
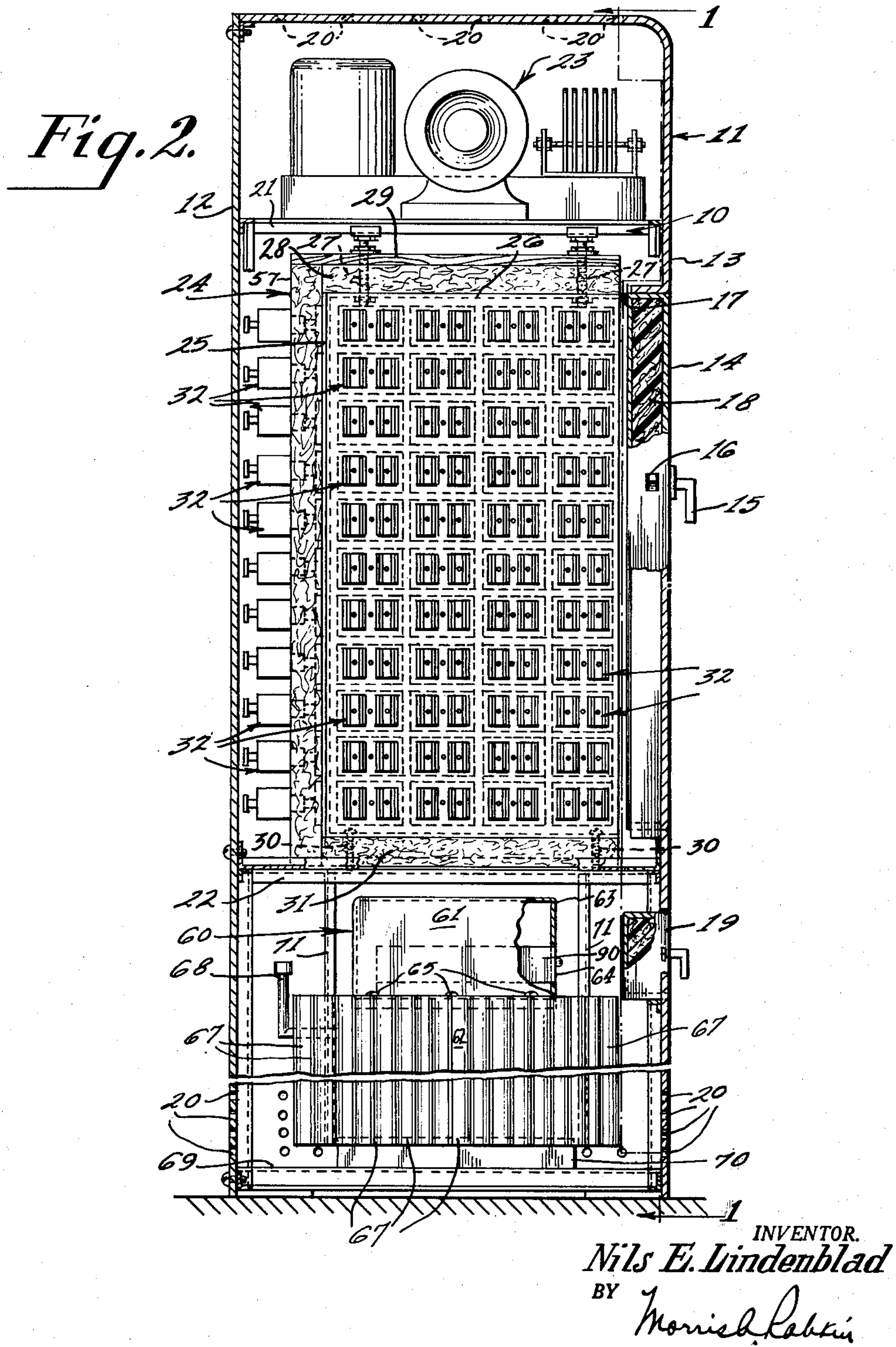
Figure 2 is a side view, in section, of the refrigerator shown in Fig. 1, the section being taken along the line 2—2 as viewed in the direction of the arrows.

In Figs. 1 and 2 of the drawing, an overall view of an assembled refrigerator constructed in accordance with the present invention may be obtained. The units of the refrigerator are mounted with a framework 10 of angle irons. A casing 11 of sheet metal which may be porcelain coated on external surfaces if desired is secured to the framework 10 and encloses the assembly. The back 12 of the casing 11 is fastened to the framework 10 by means of screws so that it may be removed when the refrigerator needs servicing. The front wall 13 of the casing 11 is provided with two openings. A door 14 is fitted into one of the openings. The door may swing from hinges (not shown) and has a handle 15 and latch 16. In order to prevent the escape of cold from the cooling compartment 24, to be described later herein, a gasket 17 is placed around the inside edge of the door 14. The door is provided with a hollow chamber into which insulation 18 is inserted. The other opening is provided near the bottom of the front casing wall 13. Another door 19 is fitted into this opening. This door 19 provides access to a freezing chest 60 which will be described later. The door is similar in construction to the door 14 described above. Air vents 20 are provided near the bottom and in the top of the casing 11. These vents permit the circulation of air by means of a chimney effect established inside of the refrigerator in a manner to be described in detail hereinafter. This circulation is advantageously utilized to cool the heat generating elements of the refrigerator as will appear presently from the following description.

Horizontally disposed angle irons 21 and 22 of the framework 10 provide support for the units of the refrigerator at various levels in the casing 10. A power supply 23 is supported near the top of the refrigerator by angle iron 21. This power supply, as may be observed from the components thereof, is a direct current power supply which may be of a conventional type. It is used to convert alternating current from the power lines to direct current which is used in the thermoelectric heat pumps of the refrigerating apparatus. The cooling compartment unit 24 is located in the intermediate portion of the refrigerator. This unit is suspended from the angle iron 21, and is also secured to the lower angle iron 22.

The cooling compartment is provided by a rectangular box 25. The box 25 may be made of metal such as aluminum. The face of the box 25 that is disposed opposite the door 14 in the casing 11 is open. The top 26 of the box 25 is fastened to the horizontally disposed angle irons 21 by means of bolts 27. However, interposed between the top 26 of the box 25 is a layer of insulating material 28, such as plastic foam, covered by wood planking 29. The wood planking 29 serves to hold the insulating material 28 in place. The bottom of the box 25 is secured to the lower horizontal irons 22 by means of bolts 30. A layer of insulating material 31, such as plastic foam, is placed to cover the bottom of the box 25.

Figures 3, 4, 7:
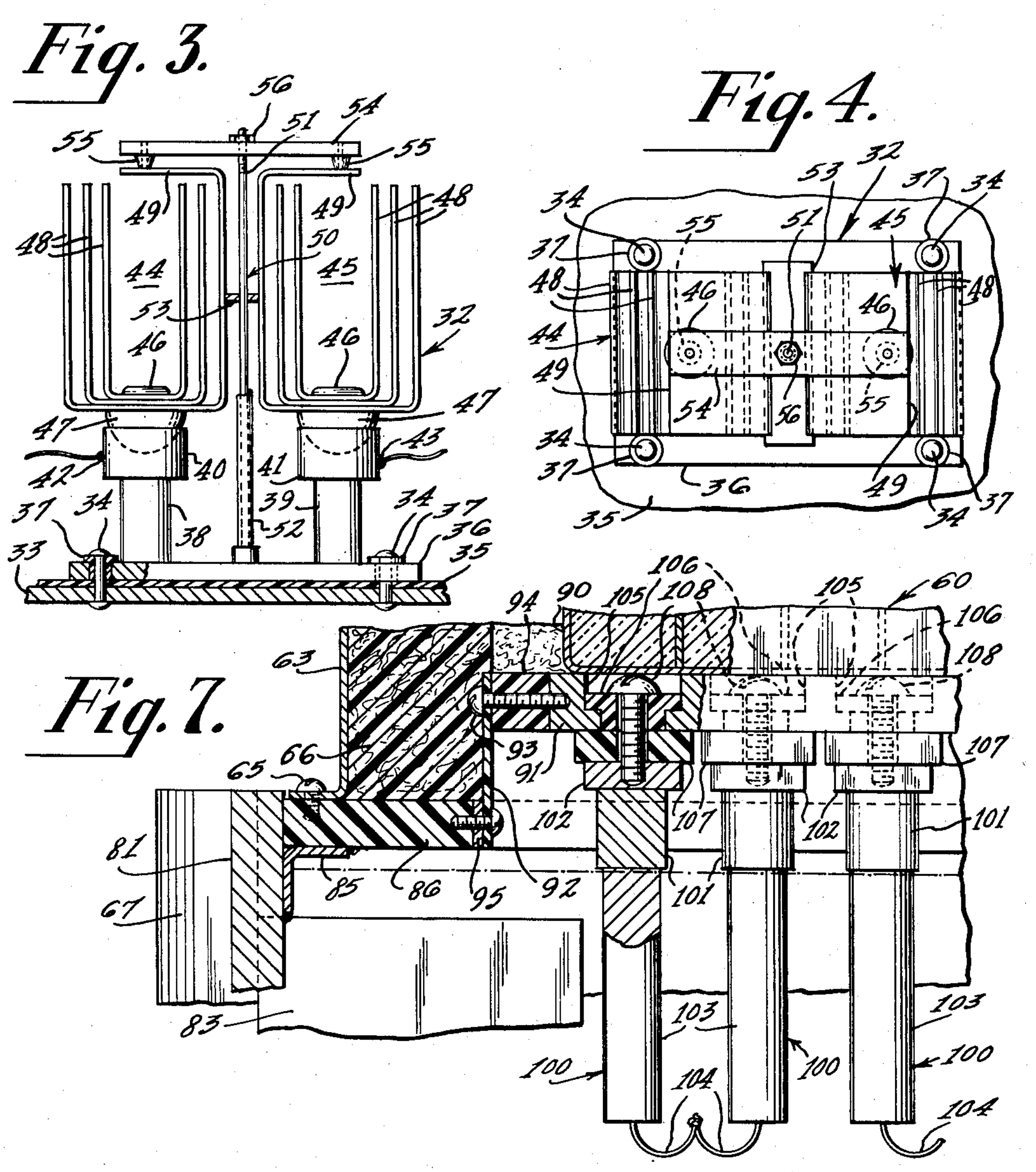
Fig. 3 is a view, in elevation, of an individual thermocouple cooling element of the refrigerators of Figs. 1 and 2.
Fig. 4 is a plan view of the cooling element shown in Fig. 3.
Fig. 7 is a fragmentary sectional view, in greater detail, of a portion of the freezing unit shown in Figs. 5 and 6, the section being taken along the line 7—7 of Fig. 6 as viewed in the direction of the arrows.

In order to cool the cooling compartment box 25 to the degree necessary for the cold storage of food and the like, a thermoelectric heat pump is provided that is both convenient and efficient. This thermoelectric heat pump consists of a plurality of interconnected thermocouple elements 32 that are secured to the side walls and the rear wall of the box 25. A representative one of these thermocouple elements 32 is shown in Figs. 3 and 4.

The wall 33 of the box 24, on which the illustrated thermocouple element 32 is mounted, has spaced holes drilled therein which receive rivets 34 for attaching the thermocouple element 32 to the wall 33. Other, similarly spaced holes are drilled in the walls of the box 25 to accommodate the other elements 32. Interposed between the wall and the thermocouple element is a thin sheet 35 of insulating plastic. A suitable plastic material for this purpose is Mylar. Mylar is the trade name for a polyester material (polyethylene therephthalate). The Mylar sheet 35 serves to insulate the individual thermocouple elements from the conductive wall 33 of the cooling compartment box 25. However, the sheet 35 is sufficiently thin so that it does not thermally isolate the thermocouple element from the walls 33.

The thermocouple element 32 is constructed with a rectangular base plate 36. This plate may be made of material having good thermal and electrical conductive properties, such as aluminum or copper. Insulating washers 37 are inserted in the holes drilled near the corners of the plate 36. The rivets 34 that secure the thermocouple element to the wall 33 of the box 25 are electrically insulated from the base plate 36 by means of these washers. Thus, short circuits are prevented between the individual thermocouple elements 32 through the wall 33.

Two cylindrical bodies 38 and 39 of dissimilar thermoelectric materials are secured to the plate 36 at one end thereof. A good physical and electrical connection may be made between the ends of the thermoelectric bodies by means of soft solder. The materials constituting the bodies 38 and 39 are thermoelectrically dissimilar in that they have different thermoelectric powers. For example, one of the bodies may be made of bismuth and the other body may be made of antimony. Other similarly acting thermoelectric alloys may be used. If a current of electricity is caused to flow across the conductive junction of two thermoelectrically dissimilar materials, an evolution or an absorption of heat results. This phenomenon is theoretically based on the premise that the two materials are at different energy levels. Therefore, an exchange of heat into work or an exchange of work into heat results when current flows through a body of one material into a body of the other material through the junction. The plate 36, consequently, forms the conductive junction between the bodies of 38 and 39 of dissimilar thermoelectric materials. Since cooling of the cooling compartment is desired, the plate 36 will be utilized as the cold junction of the thermocouple element 32. In the operation of the refrigerator, current will be directed through the thermocouple elements 32 in a direction such that the heat absorbing or cold junction is formed at the plate 36 of each element 32.

Secured to the upper end of each of the cylindrical bodies 38 and 39 of thermoelectric material are metal cylinders 40 and 41 of larger diameter than the bodies 38 and 39. These cylinders 40 and 41 may be soldered to the ends of the bodies 38 and 39. A cup-shaped recess, shown herein as being hemispherical, is bored in the upper portion of each cylinder 40 and 41. These recesses serve as sockets as will be brought out later herein. Terminal leads 42 and 43 are attached to the sides of each of the metal cylinders 40 and 41. These terminal leads may, for instance, be series connected with the terminal leads of the other thermocouple elements 32 that are mounted to the wall 33.

Since the plate 36 will be the cold junction of the thermocouple element 32, the metal cylinders 40 and 41 are the hot junctions of the element. It is a feature of the present invention to dissipate the heat generated in these hot junctions in a convenient and efficient manner by utilizing air cooling. Arrangements of cooling fins 44 and 45 are mounted onto the hot junctions.

These cooling fin arrangements 44 and 45 are especially constructed so as to provide the maximum cooling surface for the limited area that may be available in a compact refrigerator. Thus, the cooling fins 44 and 45 function optimally as heat dissipating members.

Another problem that is incurred in providing cooling fins for the hot junctions of the thermoelectric bodies 38 and 39 is that the bodies 38 and 39 are made of highly brittle material. Any shear or bending stresses that may be applied to the bodies 38 and 39 can cause them to break apart. The bodies 38 and 39 can withstand compression forces to some extent. It is, therefore, another feature of the invention to mount the cooling fins 44 and 45 on the thermoelectric bodies 38 and 39 without placing damaging sheer or bending stresses on the bodies 38 and 39. To this end, the plurality of U-shaped metal plates 48 from which the sets of fins 44 and 45 are constructed, are secured together at the bottom by means of rivets 46. Metal ball-like members 47 which are adapted to fit into the socket-like recesses in the metal cylinders 40 and 41 are secured to the underside of the fin arrangements 44 and 45 by means of the rivets 46. The ball-like member 47 may form part of the rivets 46. The fin arrangements 44 and 45 are, thus, pivotly mounted in the sockets formed by the recesses in the metal cylinders 40 and 41.

Means as provided for maintaining the fins in a stationary position. The outermost of the fins 48 in the fin arrangements 44 and 45 is formed with an extension 49 which is bent perpendicular to the sides of the fin. A depression is formed in this extension 49 at a point thereon that is coincident with the center of the ball 47. A T-shaped supporting post or bracket 50 is used to hold the fins 44 and 45 in a stationary position. This post 50 includes a metal rod 51 which is secured at its lower end in the plate 36. A sleeve 52 of insulating material covers the rod 57. An insulating spacer 53 is inserted on the rod and separates the outer fins 48 to prevent them from contacting each other so as not to short circuit the thermocouple element 32. A cross bar 54 which may be made of metal has a hole therein into which the upper end of rod 51 is inserted. The upper end of the rod 51 is threaded. A nut 56 fits on the rod over the cross bar 54. Nipples 55 made of insulating material depend from the underside of the cross bar 54. These nipples 55 cooperate with the depressions formed in the extension pieces 49 of the outermost fins 48. Consequently, the post maintains the sets of fins 44 and 45 on the thermocouple bodies 38 and 39 in a stationary position. By adjusting the position of the nut 56 on the rod 51, the amount of tension on the fins may be altered. Thermocouple element is, therefore, a non-rigid assembly. It has been mentioned that the bodies 38 and 39 of thermoelectric material are soldered to the plate 36, and that the metal cylinders 40 and 41 are also soldered to the thermoelectric bodies 38 and 39. This construction may be modified. All parts of the element may be separable and readily assembled when needed without the use of fastening methods such as soldering. Consequently, each of the parts may be made individually and put together in a final assembly operation. Such construction techniques are highly adaptable to mass production. It will be observed from the description of the refrigerator herein that substantially all of the parts of the refrigerator may be constructed individually and easily assembled to form the entire refrigerator. Thus, this refrigerator is highly adaptable to mass production.

The disposition of the thermoelectric elements 32 in uniformly distributed arrays on the side and rear walls of the cooling compartment box 25 is shown in Figs. 1 and 2. In order to prevent the escape of cold from the cooling compartment 24 layers 57 of insulating material, such as plastic foam, may be placed to cover the rear and side walls of the box. These layers 57 of plastic foam may be shaped to fit under the cooling fins 40 of the thermocouple elements 32.

In the schematic diagram of the cooling compartment unit 24 illustrated in the drawing of Figs. 1 and 2, the interconnection of the individual thermocouple elements has not been shown for purposes of clarity of illustration. It will be appreciated, however, that the elements are connected in series. The electrical circuit of the regrigerator will be described in greater detail later herein.

A freezing chest unit 60 is located under the cooling compartment unit 24. This freezing chest unit 60 may be considered as being composed of two sections. The first section 61 comprises an insulated chamber wherein a freezing zone is provided and its associated heat pump. The other section 62 provides heat exchange means for cooling the thermoelectric heat pump to an extent that it may drop the temperature in the freezing chamber into the freezing zone. As schematically indicated in Figs. 1 and 2, the freezing chamber is provided by a metal box 63. A small door 64 is located in the front of the box 63. The door 19 in the lower portion of the refrigerator casing 11 may be opened to provide access to the door 64. The metal box 63 is secured to the second section 62 by means of nuts 65 extending through holes in a flange along the bottom edge of the box 63. The box 63 is well insulated by means of internally disposed layers 66 of insulating material, such as plastic foam.

An arrangement of fins 67 for the purpose of dissipating heat from the heat generating elements in the thermoelectric heat pump of the freezing chest unit is arranged on the outside of the cooling section 62. As will be brought out later herein, a cooling fluid such as water is used in the cooling section 62. The cooling section 61 may be filled or drained through a pipe 68.

The entire freezing chest unit 60 is supported on angle irons 69 which form the bottom of the frame 10 of the refrigerator. Cross bars 70 are disposed over and secured to the angle irons 69. The cross bars 70 may be welded to the angle irons 69. Four angle irons 71 which are firmly secured to the freezing chest unit are welded to the cross bars 70 and are also fixed to the intermediate angle irons 22 in the framework 11. These vertical angle irons 71 lend lateral support to the freezing chest on the cross bars 70.

Figure 5:
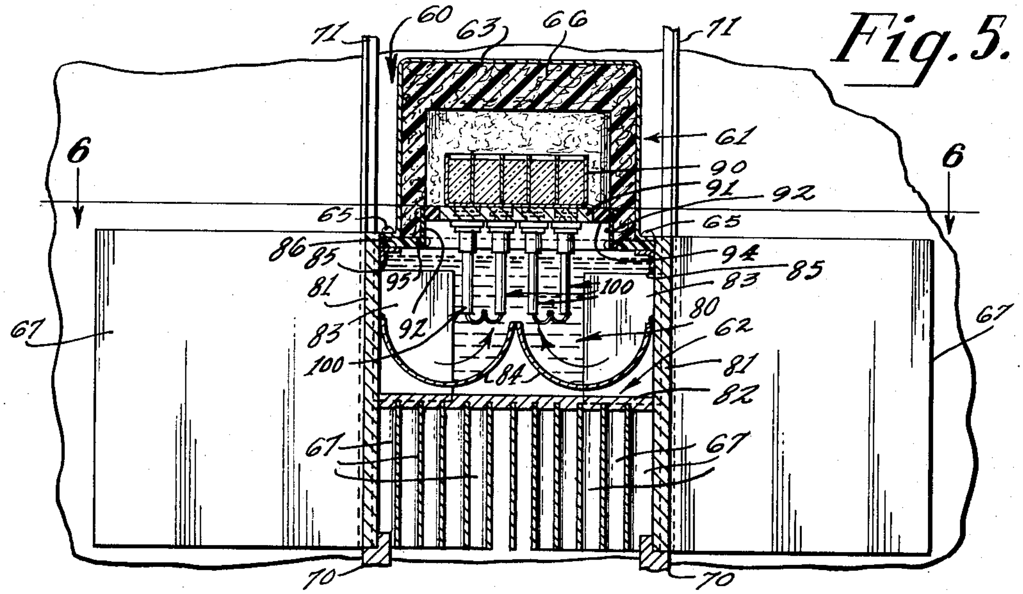
Fig. 5 is a sectional view of the freezing chest unit of the refrigerator shown in Figs. 1 and 2, the section being taken along the line 5—5 of Fig. 6 as viewed in the direction of the arrows.
Figure 6:
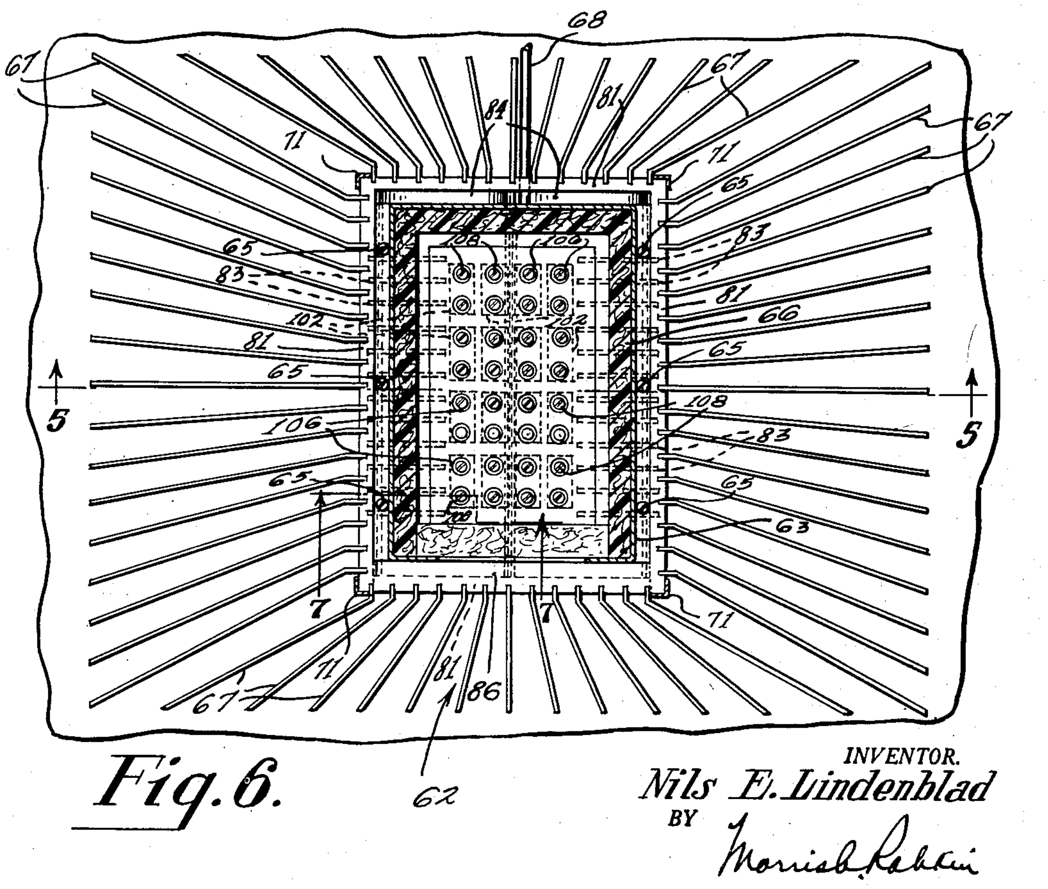
Fig. 6 is a sectional plan view of the freezing chest unit shown in Fig. 5, the section being taken along the line 6—6 as viewed in the direction of the arrows.

Further details of the freezing chest unit may be obtained by referring to Figs. 5 and 6. The cooling section 62 of the freezing chest unit 60 includes a receptacle or tank 80 which contains cooling fluid. The tank 80 is constructed with four side walls 81 and a bottom wall 82. It is desirable that these walls 81 and 82 be made out of metal which has good thermal conductive properties. Copper or copper alloy is suitable for this purpose. A plurality of fins 67 are inserted in the outer face of side walls 81 and extend across the bottom wall 82 of the tank. Grooved inserts in the walls 81 and 82 of the tank are provided for the fins 67. A firm connection between the fins 67 and the walls 81 and 82 may be provided by a suitable fastening method, such as soldering or brazing. The height of the fins 67 may be greater than the height of the tank 80 so that large heat dissipating surfaces are provided. The fins 67 are also flared so that the largest number of fins may be provided in the space available for the freezing chest unit 60.

An arrangement of fins 83 is located inside of the tank 80. These fins 83 are inserted into grooves in the side and bottom walls 81 and 82 of the tank 80, and may be permanently attached to the walls by soldering or brazing. Use of the interior fins 83 results in more efficient heat dissipation since the fins 83 conduct heat to the walls 81 and 82 of the tank 80 and, thus, to the large exterior fins 67. Trough shaped deflectors 84 may also be placed inside the tank 80. These deflectors 84 tend to direct the flow of the cooling fluid, which is placed in the tank for the purpose of carrying heat from the heat generating elements of the thermoelectric heat pump to the heat dissipating fins.

The section 61 of the freezing chest unit which includes the insulated freezing chamber 61 may be made removable from the cooling section 62 if desired. This section 61 rests upon an inwardly extending bracket 85 which extends along the inside of the side walls 81 of the tank 80. As illustrated in greaer detail in Fig. 7, the bottom of a rectangular plate 86 made of plastic, such as Bakelite, and having a larger rectangular hole therein is disposed over the tank 80 and rests upon the bracket 85. The box 63 containing the freezing chamber rests upon the plate 86. The nuts 65 secure the box 63 to the plastic plate 86.

The plastic plate 86 serves another function; that is to support the thermoelectric heat pump for the freezing chest unit.

The water in the tank 80 does not extend above the top of bracket 85, however, the water level may be almost up to the bracket 85 as indicated by the dot-dash line in the drawing.

An ice tray 90 with water therein is shown resting upon a plate 91 in the floor of the freezing chamber defined by the layers of insulating material 66. The thermocouple elements 100 of the thermoelectric heat pump are attached to this floor plate 91. The floor plate 91 is supported by the rectangular plastic plate 86 by means of thin strips of plastic 92, such as Bakelite, that are attached along opposite sides of the rectangular hole in the plastic plate 86. These strips 92 are fastened at several points along the length to the oppositely disposed sides of the support plate 86 and the floor plate 91 by means of screws 93. Another strip 94 of plastic, such as Bakelite, having a rectangular cross-section is disposed between the top of the thin plastic strip 92 and the metal floor plate 91. Holes in the other strip 94 of plastic are provided for the passage of the screws 93. An aluminum strip 95 is sandwiched between the lower part of the thin plastic strip 92 and the plastic plate 86. This arrangement has been found to provide sufficient support for the floor plate 91 and the thermoelectric heat pump, the plate 91, and items such as the ice tray 90. Moreover, the arrangement using the strip 92 has been found to reduce the conduction of heat from the ambient into the freezing chamber.

The individual thermocouple elements 100 that are used in the heat pump for the freezing chest 60 each utilize a pair of bodies 101 composed of dissimilar thermoelectric material. The bodies 101 may be made of the same materials as used in the thermocouple elements 32 for the cooling compartment 24. Only the forward most of the pair of bodies 101 of each of the thermocouple elements may be observed in the drawing. The pair of thermoelectric bodies in each thermocouple element 100 is attached to a rectangular conductive plate 102. The bodies may be soldered to the plates. Depending from the bottom of each of the bodies 101 is a cylindrical rod 103 of metal having properties of high thermal conductivity. These rods 103 may be made of copper, for example. The rods 103 are sufficiently long so that they extend into water in the tank 80. Most of the length of the rods 103 is desirably submerged in the water. The thermocouple elements 100 are connected in series. For example, the ends of the rods 103 may be connected by wires 104 as indicated. The thermocouple elements 100 are interconnected so that cold junctions are provided by the plates 102 and hot junctions are provided by the rods 103.

The heat generated in the rods is dissipated in the water. The water around the rods 103 becomes heated. The water at other parts of the tank, and particularly around the fins 83 and the walls 81, will be cooler than the water in the region of the rods 103. Consequently, circulation of the water due to convection will be produced during the operation of the heat pump. Due to this circulation the heat will be carried away from the submerged rods 103 and dissipated through the fins 83 to the walls 81 of the tank and the fins 67 outside of the tank. The fins 67 will dissipate the heat into the ambient. Thus, the present invention provides for the efficient cooling of the thermoelectric heat pump in which the features of liquid and air cooling are combined.

The thermocouple elements 100 are secured to the underside of the metal plate 91. Holes 105 are drilled and countersunk in the top of metal floor plate 91. Insulating washers 106 having shoulders thereon are inserted in these holes. A thin sheet or strips of insulating material 107 is placed so as to provide electrical insulation between the plates 102 of the thermocouple elements 100 and the floor plate 91. A strip of Mylar having holes punched therein may be used. Screws 108 which extend through the holes 105 and rest upon the washers 106 are used to engage cooperating threaded holes in the plates 102. Thus, the individual thermocouple elements 100 are held securely in place at the bottom of the plate 91. The insulating strip 107 is sufficient to provide electrical insulation between the thermocouple elements 100 and the plate 91. However, they are sufficiently thin not to thermally isolate the cold junctions from the floor plate 91. The plate 91 thereby becomes very cold and absorbs sufficient heat from the insulated freezing chamber 61 to create a freezing zone therein.

Referring to Figs. 1 and 2, it may be observed that the freezing chest unit 60 is disposed at the bottom of the refrigerator casing 11. The cooling compartment unit 24 is arranged above the freezing chest unit 60. The power supply 23 is placed above both of the refrigerating units 24 and 60. The greatest amount of heat is generated by the power supply 23; while the cooling compartment 24 and the freezing chest unit 60 can be expected to dissipate smaller and still smaller amounts of heat, respectively, during the operation of the refrigerator. Arranging the refrigerating apparatus in the ascending order of the units that dissipate greater amounts of heat above the units that dissipate smaller amounts of heat produces a circulation of air through the casing. Consequently, the need for forced air cooling is made unnecessary for the majority of uses for the refrigerator. It will be observed that air will enter through the vents 20 in the lower part of the casing 11 and rise due to convection. This air will pass through the vents 20 at the top of the casing. In order to fully utilize the convection, circulation of air and the heat dissipating fins of each of the units 24 and 60 are aligned with their top edges in the vertical direction. This permits the circulating air to pass over the largest surface of the plates and carry away the heat to be dissipated by the fins.

Figure 8:
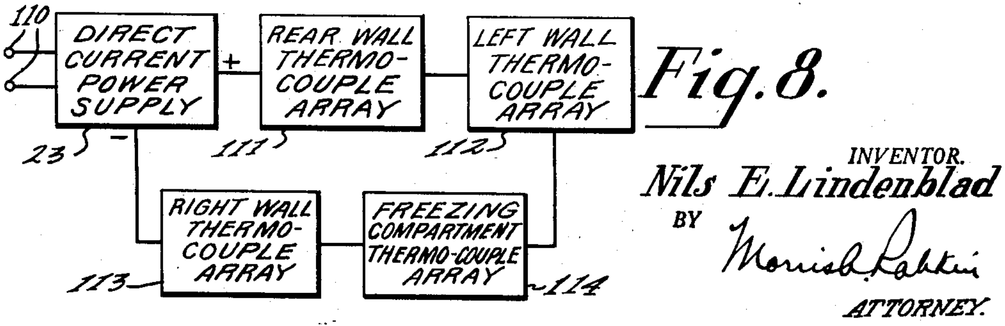
Fig. 8 is an electrical schematic diagram of the refrigerator illustrated in Figs. 1 to 7.

In Fig. 8 the interconnection of the thermocouple elements in the various heat pumps of the refrigerating apparatus heretofore described is shown. A pair of terminals 110 is connected to the input of the direct current power supply. These terminals 110 are available for connection to a source of electrical power of the refrigerator. For example, they may be connected to the alternating current power lines. The thermocouple elements 32 in the array fastened on the rear wall of the cooling compartment box 25 are connected in series. Therefore, this array of thermocouple elements may be considered as a unit 111. Similarly, the thermocouple elements 32 in the array on the left wall of the cooling compartment box 25 are interconnected in series. The left wall thermocouple array, therefore, is also considered as a unit 112. The thermocouple elements on the right wall of the box are also connected in series and may be considered as a unit 113. The freezing compartment heat pump contains a number of thermocouple elements 100 which are interconnected in series. Thus, the freezing compartment thermocouples may be considered as a unit array 114. All the unit arrays 111, 112, 113 and 114 are connected together in series. The rear wall array 111 is shown as being connected through the positive terminal of the direct power supply 23 and the arrays 112, 114 and 113 are connected thereto in the order mentioned. The right wall thermocouple array is shown as being connected to the negative terminal of the power supply 23. The order of connection of the various units between the terminals of the power supply 23 is immaterial. The only criteria of the interconnection of the various arrays 111 to 114 is that the proper polarities are observed so that cooling results at the junction of the individual thermocouple elements that are connected to the refrigerated chambers.

The present invention, therefore, provides improved thermoelectric refrigerating apparatus utilizing air cooling of the heat dissipating members. The compact assembly and structural relationship of the various refrigerating units provides for many advantages over prior apparatus of this type including efficient operation and convenience of construction.

What is claimed is:

1. A thermoelectric refrigerator comprising a freezing chest unit, a thermoelectric heat pump associated with said freezing chest, said thermoelectric heat pump being provided with heat dissipating members arranged in heat exchange relationship with the ambient, a cooling compartment unit, another thermoelectric heat pump associated with said cooling compartment, said last-named thermoelectric heat pump being provided with heat dissipating members arranged in heat exchange relationship with the ambient, an enclosed structure having air inlet means near the bottom thereof communicating with air outlet means in the upper portion thereof through an air circulation path, said enclosed structure being provided for supporting said cooling compartment unit and said freezing compartment unit with the heat dissipating members of each of said units in alignment in the direction of said path, and said heat dissipating members of said heat pump of the one of said units generating the larger amount of heat being disposed above the heat dissipating members of the other of said units whereby a convective circulation of air is provided in an upward direction along said path through said structure adapted to successively pass in heat exchange relationship with said heat dissipating members of said heat pumps.

2. A thermoelectric refrigerator comprising a plurality of walls, a freezing chest unit, a thermoelectric heat pump for cooling said freezing chest unit, said thermoelectric heat pump being surrounded with heat dissipating members arranged in heat exchange relationship with the ambient, a plurality of walls providing cooling compartment unit, a thermoelectric heat pump for cooling said cooling compartment unit, said last-named thermoelectric heat pump being provided by arrays of thermocouples having hot junctions and cold junctions distributed over said walls of said cooling compartment, said hot junctions extending outwardly from said walls and being provided with heat dissipating members individually attached thereto, a plurality of walls providing a casing structure having air inlet means near the bottom thereof and air outlet means near the top thereof, said freezing chest unit and said cooling compartment unit being enclosed by said casing structure, said walls of said cooling compartment and said freezing chest being spaced from said walls of said structure to provide an air space into which said heat dissipating members thereof extend, and said freezing compartment unit and said freezing chest unit being arranged in said structure with the one of said units generating the larger amount of heat being disposed above the other.

3. A thermoelectric refrigerator comprising a power supply, a freezing chest unit, a thermoelectric heat pump for cooling said freezing chest unit, said thermoelectric heat pump being provided with heat dissipating members surrounding said unit and arranged in heat exchange relationship with the ambient, a cooling compartment unit, a thermoelectric heat pump provided by arrays of thermocouples distributed over the walls of said compartment, each of said last-named thermocouples having cold junctions disposed adjacent said walls and hot junctions spaced from said cold junctions, said compartment thermocouple hot junctions being each provided with heat dissipating members extending outwardly from said walls of said compartment, a casing for said refrigerator provided by a walled enclosure, air inlet means at the bottom of said casing, and air outlet means at the top of said casing, said casing having means therein for supporting said power supply over said cooling unit and said freezing chest unit under said cooling compartment unit, said walls of said casing being spaced from said units to provide a rising column of air between said walls of said casing and said units therein, said column of air communicating with said air inlet and outlet means which passes in heat exchange relationship with said heat dissipating members.

4. A thermocouple element for a thermoelectric heat pump comprising a plate of conductive material, a pair of bodies of dissimilar thermoelectric material mounted on said plate at one end thereof, members providing for the transfer of heat between said thermocouple element and the ambient, and means extending from said plate for supporting said members, said members being supported from said plate in abutting relationship with the other ends of said bodies.

5. A thermocouple element for a thermoelectric heat pump comprising a plate, two bodies of thermoelectric material, the material of one of said bodies being thermoelectrically dissimilar from the material of the other of said bodies, one end of each of said bodies being mounted on one side of said plate, heat dissipating members providing for the transfer of heat between said thermocouple element and the ambient, said members being pivotally mounted in detachable abutting relationship with the other ends of said bodies, and means attached to said plate for supporting said members in stationary position on said other ends of said bodies.

6. A thermocouple element for a thermoelectric heat pump comprising a plate of conductive material, two bodies of thermoelectric material, the material of one of said bodies being thermoelectrically dissimilar from the material of the other of said bodies, one end of each of said bodies being mounted on one side of said plate, conductive receptacles having cupped shaped recesses therein mounted on the other end of each of said bodies, two sets of fins, the ends of each of said sets of fins being individually provided with a ball shaped bearing, and a post attached at the lower end thereof to said plate and at the upper end thereof to said sets of fins, said post being provided with means for supporting each of said sets of fins with said bearing disposed in said recesses.

7. Thermoelectric refrigerating apparatus comprising a cooling compartment formed by a plurality of intersecting walls, said walls being composed of thermally conductive material, thermocouple elements disposed at spaced intervals over at least one of said walls; each of said thermocouple elements comprising two bodies of dissimilar thermoelectric material, a metallic plate, arrangements of cooling fins, and means for supporting each of said bodies between and in contact with one side of said plate and one of said arrangements of cooling fins; a sheet of electrical insulating material and means for fastening each of said plates to said one wall whereby said sheet is sandwiched between each of said plates of said individual thermocouple elements and the exterior of said wall of said compartment.

8. Thermoelectric refrigerating apparatus comprising a cooling box formed by a pair of side walls, a rear wall, a top wall and a bottom wall, thermoelectric cooling elements disposed at spaced positions on said rear and said side walls, said thermoelectric cooling elements comprising a plate of metal, a sheet of insulating material, said plate being secured to the exterior of said wall through said sheet, bodies of dissimilar thermoelectric material mounted on said plate at one end thereof, and a set of cooling fins formed of other plates of thermally conductive material mounted in thermal contact with the other end of each of said bodies, said cooling fins being disposed with the surfaces of said plates in the same direction.

9. Thermoelectric refrigerating apparatus comprising a cooling compartment formed by a plurality of intersecting walls, a thermoelectric heat pump disposed on at least one of said walls, said heat pump including an array of thermocouple elements distributed over the exterior of said one wall, each of said elements being provided by two bodies of dissimilar thermoelectric material, said bodies being joined together at one end thereof to provide a cold junction, hot junctions thereby being provided at the other ends thereof, means connecting said cold junctions to said one wall in thermal contact and electrical isolation at spaced points on the exterior of said one wall, heat dissipating members for dissipating the heat generated from said hot junctions into the ambient, and means for individually mounting said heat dissipating members on said other ends of said bodies.

10. In a thermoelectric refrigerator having a freezing chest, a thermoelectric heat pump disposed to cool said freezing chest, said thermoelectric heat pump comprising a plate of conducting material, thermoelectric cooling elements provided with hot junctions and cold junctions being mounted on said plate, said cold junctions being secured to one side of said plate, said hot junctions having metallic members extending therefrom, a receptacle adapted to contain a fluid, said receptacle being provided by walls having cooling fins disposed therein and extending therefrom, a deflector plate disposed in the interior of said receptacle for directing the circulation of said water and means for mounting said plate upon the walls of said receptacle so that said metallic members are submerged in said fluid.

11. In a thermoelectric refrigerator, a freezing chest provided by insulated walls disposed along the top and sides thereof, a metal plate positioned at the bottom of said freezing chest, a receptacle provided by metal walls and adapted to contain a fluid, said walls being provided with a plurality of heat dissipating fins extending from said walls into said receptacle and extending out of said receptacle into the ambient, a plurality of thermocouple elements being secured to the lower side of said plate, said thermoelements having hot junctions and cold junctions, said cold junctions being disposed in thermal contact with said plate, and elongated cylindrical metal members attached to said hot junctions and extending into said receptacle so as to be submerged in said fluid whereby circulation of said fluid due to convective currents established therein removes heat generated by said hot junctions.

References Cited in the file of this patent

UNITED STATES PATENTS 1,818,437 Stuart ---------------- Aug. 11, 1931

FOREIGN PATENTS 259,564 Great Britain ---------- July 21, 1927

UNITED STATES PATENT OFFICE

CERTIFICATE OF CORRECTION

Patent No. 2,872,788 February 10, 1959

Nils E. Lindenblad

It is hereby certified that error appears in the printed specification of the above numbered patent requiring correction and that the said Letters Patent should read as corrected below.

Column 2, line 9, for "nature of fans" read -- nature of fins --.

Signed and sealed this 16th day of February 1960.

(SEAL)

Attest:

KARL H. AXLINE
Attesting Officer

ROBERT C. WATSON
Commissioner of Patents